United States Patent
Asada et al.

(10) Patent No.: US 6,307,259 B1
(45) Date of Patent: Oct. 23, 2001

(54) PLASTIC PACKAGE FOR SEMICONDUCTOR DEVICE

(75) Inventors: Kenji Asada; Toshio Hamano; Mitsuo Abe, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/262,066

(22) Filed: Mar. 4, 1999

(30) Foreign Application Priority Data

Apr. 2, 1998 (JP) .................................................. 10-090287

(51) Int. Cl.$^7$ .................................................. H01L 23/52

(52) U.S. Cl. .......................... 257/691; 257/711; 257/774; 257/773; 257/784; 257/780; 257/700; 257/698

(58) Field of Search ..................................... 257/691, 711, 257/774, 773, 784, 780, 700, 698

(56) References Cited

U.S. PATENT DOCUMENTS 5,787,575 * 8/1998 Banerjee et al. ........................ 29/832

* cited by examiner

Primary Examiner—Tom Thomas
Assistant Examiner—Luan Thoi
(74) Attorney, Agent, or Firm—Armstrong, Westerman, Hattori, McLeland & Naughton, LLP

(57) ABSTRACT

According to the present invention, for a multi-layer plastic package having bonding pads at multiple levels, a plurality of electrically independent side wall conductive layers can be provided by forming side wall conductive layers on the side wall of an opening in each insulating layer. In particular, when the insulating layer forms a multi-layer structure, side wall conductive layers are formed on each of the individual side walls of the multi insulating layers, and a pre-impregnated layer is inserted between each two insulation layers, so that a plurality of electrically independent side wall conductive layers can be provided. Even for an insulating layer having a single layer structure, side wall conductive layers are formed so as to be electrically separated from each other, so that a plurality of side wall conductive layers can be provided.

2 Claims, 9 Drawing Sheets

First embodiment

First embodiment

Second embodiment

Third embodiment

Six embodiment

PLASTIC PACKAGE FOR SEMICONDUCTOR DEVICE

BACKGROUND OF THE INVENTION

1. Field of the Invention

The present invention relates to a multi-layer plastic package within which a semiconductor chip is accommodated, and in particular to an innovative structure for a multi-layer plastic package within which a power source bonding pad and a power source plane layer are directly connected through the side wall of an opening in order to reduce the inductance of a power source.

2. Related Arts

A plastic pin grid array package (PPGA), or a plastic ball grid array package (PBGA) has become popular as a package for accommodating an LSI chip for which large number of input/output terminals are required. For example, a large LSI chip which requires the large number of input/output terminals, such as ASICs, can be accommodated within a package in which external terminals are arranged in the form of a grid. A multi-layer structure is employed for such a package because in addition to a signal wiring layer for the connection of signal input/output terminals, power source plane layers are provided for a supply of power and for a ground.

Instead of a conventional package, wherein are laminated a plurality of ceramic substrates, a plastic package has been proposed for use as a multi-layer LSI package. In the design of the plastic package, similar to a printed circuit board, core layers made of resin and formed conductive layers, and pre-impregnated layers, which are also made of resin, for bonding with the core layers are laminated.

With recently available devices, frequency and power consumption tend to be increased, and an appropriate structure for these factors is required for a package in which a chip can be accommodated. For example, first, a package is multi-layered, with a power source plane layer and a ground plane layer being provided in order to ensure the supply of a constant, large current. Second, the inductances in the power source plane layer and the ground wiring are reduced to the extent possible. Third, a power source and a ground plane layer are sandwiched between signal wiring layers to match the impedances of the signal lines. Fourth, crosstalk occurring between the signal lines is reduced. And finally, the change of the potentials in the power source and the ground are reduced to the extent possible.

In line with the above, a package has been proposed wherein a grounding bonding pad and a grounding plane layer are directly connected using a side wall conductance layer, which is formed on the side wall of an insulating layer.

However, with the conventionally proposed package structure, inductance can not be reduced for both a power supply source and a ground power source (in this specification, the power supply source and the ground power source are called power sources. Therefore, the power supply source is referred to as a first power source, and the ground power source is referred to as a second power source).

Furthermore, recent LSI devices have a plurality of types of power supply sources and a plurality of types of ground power sources. For such a device, the power supply source and the ground power source must be separately provided for a package prepared for the accommodation of an LSI chip. And it is difficult to reduce the inductance of all of the power sources.

In addition, since a side wall conductive layer is provided, a short circuit may occur with a bonding wire that is connected to a signal bonding pad. Further, a die attachment material on a die stage may short-circuit with a side wall conductive layer by forming a side wall conductive layer.

A package structure which can satisfactorily cope with the many conditions enumerated above has not yet been proposed.

SUMMARY OF THE INVENTION

It is, therefore, one objective of the present invention to provide a plastic package which can reduce the inductance of a power supply source and of a ground power source.

It is another objective of the present invention to provide a plastic package which can reduce the inductances of a plurality of types of power supply sources and of a ground power source.

It is an additional objective of the present invention to provide a plastic package which can prevent the occurrence of a short circuit due to a side wall conductive layer which reduces the inductance of a power source.

It is a further objective of the present invention to provide a plastic package which can adequately acquire impedance matching for signal wiring and which reduces crosstalk between signal lines.

To achieve the above objectives, according to the present invention, for a multi-layer plastic package having bonding pads at multiple levels, a plurality of electrically independent side wall conductive layers can be provided by forming side wall conductive layer on the side wall of an opening in each insulating layer. In particular, when the insulating layer forms a multi-layer structure, side wall conductive layers are formed on each of the individual side walls of the multi insulating layers, and a pre-impregnated layer is inserted between each two insulation layers, so that a plurality of electrically independent side wall conductive layers can be provided. Even for an insulating layer having a single layer structure, side wall conductive layers are formed so as to be electrically separated from each other, so that a plurality of side wall conductive layers can be provided. According to the present invention, the thus structured side wall conductive layers are properly combined, so that multiple side wall conductive layers can be provided for a multi-layer plastic package. Therefore, via the side wall conductive layers, many power source plane layers formed on the reverse surface of an insulating layer can be independently connected, at low inductances, to conductive layers, such as bonding pads, on the obverse surface of the insulating layer.

Furthermore, in a multi-layer plastic package according to the present invention the side wall of a conductive layer is covered by an insulating coating layer. Therefore, short circuits between the side wall conductive layer and the bonding wire can be prevented. Further, short circuits can be prevented between the die attachment material for bonding an LSI chip to a support substrate and the side wall conductive layer or the bonding wire.

To achieve the above objectives, according to the present invention, a plastic package for accommodating a semiconductor chip comprises:

a first insulating layer, in which a first opening is formed to accommodate the semiconductor chip, having a plurality of bounding pads including a first power source bonding pad formed on the obverse surface around the first opening, having a first power source plane layer formed on the reverse surface, and having a first side wall conductive layer, formed on the side wall of the first opening, for connecting the first power source bonding pad on the obverse surface to the first power source plane layer on the reverse surface;

a second insulating layer laminated to the first insulating layer, in which a second opening larger than the first opening is formed, having a plurality of bonding pads including a second power source bonding pad which is formed on the obverse surface and around the second opening, having a second power source plane layer formed on the reverse surface, and having a second side wall conductive layer, formed on the side wall of the second opening, for connecting the second power source bonding pad on the obverse surface to the second power source plane layer on the reverse surface;

a support substrate provided at the first opening for mounting the semiconductor chip thereon; and first and second external power source terminals connected to the first and the second power source plane layers respectively.

Furthermore, to achieve the above objectives, according to the present invention, a plastic package for accommodating a semiconductor chip comprises:

a first insulating layer, in which an opening is formed for accommodating the semiconductor chip, having a plurality of bounding pads including a first power source bonding pad formed on the obverse surface around the opening, having a first power source plane layer formed on the reverse surface, and having a first side wall conductive layer, formed on the side wall of the opening, for connecting the first power source bonding pad on the obverse surface to the first power source plane layer on the reverse surface;

a second insulating layer laminated on the first insulating layer, in which the opening is formed;

a third insulating layer laminated on the second insulating layer, in which the opening is formed, having second power source plane layers formed on the obverse surface and on the reverse surface, and having a second side wall conductive layer, formed on the side wall of the opening, for connecting the second power source plane layers on the obverse surface and the reverse surface;

a support substrate provided at the opening for mounting the semiconductor chip thereon; and power source external terminals connected to the first and the second power source plane layers respectively, wherein the first side wall conductive layer and the second side wall conducive layer are separated by the side wall of the second insulating layer.

In addition, to achieve the above objectives, according to the present invention, a plastic package for accommodating a semiconductor chip comprises:

an insulating layer, in which an opening is formed for accommodating the semiconductor chip, having a plurality of bonding pads including first and second bonding pads formed on the obverse surface around the opening, having first and second power source plane layers formed separately on the reverse surface, and having first and second side wall conductive layers, formed separately on the side walls of the opening, for connecting the first and the second power source bonding pads on the obverse surface to the first and the second power source plane layers on the reverse surface respectively;

a support substrate provided at the opening for mounting the semiconductor chip thereon; and external power source terminals connected via through holes to the first and to the second power source plane layers respectively.

DETAILED DESCRIPTION OF THE PREFERRED EMBODIMENTS

The preferred embodiments of the present invention will now be described. It should be noted, however, that the technical scope of the present invention is not limited to these embodiments.

Figure 1:
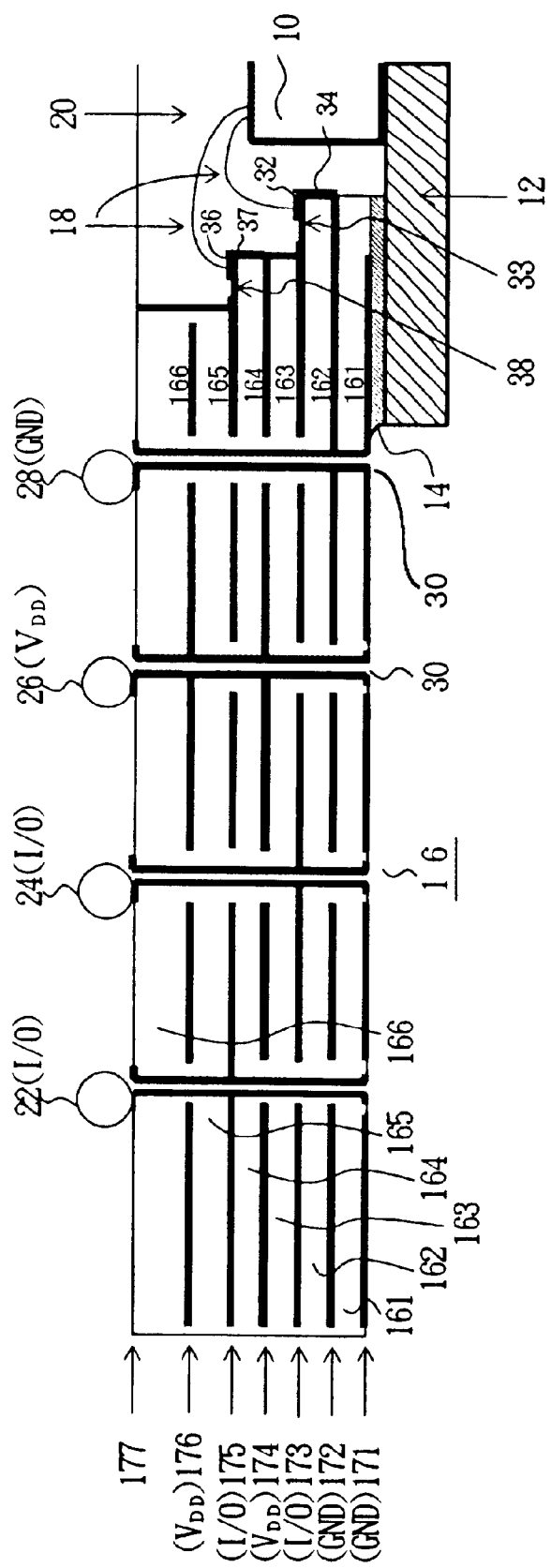
FIG. 1 is a partial cross-sectional view of a multilayer plastic package according to a first embodiment of the present invention.

FIG. 1 is a partial cross-sectional view of a multi-layer plastic package according to a first embodiment of the present invention. In the cross-sectional view in FIG. 1 is shown the left half from an LSI chip 10. The multi-layer plastic package is so structured that a support substrate 12, on which the LSI chip 10 is mounted, is attached, using an adhesive 14, to a multi-layer plastic substrate 16 in which an opening is formed. The multi-layer plastic substrate 16 is formed by the lamination of insulating layers 161 to 166, which are composed, for example, of epoxy resin. Conductive layers 171 to 177 are formed between these insulating layers an d on the outer surfaces. A plurality of through holes 30 are formed in the multi-plastic substrate 16, and external terminals 22, 24, 26 and 28, constructed as conductive balls, are provided at positions on the surface which correspond to those of through holes 30. The external terminals may also be provided as conductive pins.

The multi-layer plastic substrate 16 has the same structure as a printed circuit board, for example. Specifically, a plurality of core layers (insulating layers), which are composed of epoxy resin and which have conductive layers formed on both surfaces, are bonded with pre-impregnated layers (insulating layers) which are also composed of epoxy resin, through holes are formed, and internal conductive layers are introduced to the surfaces of th e multi-layer substrate. In the multi-layer plastic substrate 16 in FIG. 1, an insulating layer 161 consisting of a pre-impregnated layer and a core layer on one surface of which is provided the conductive layer 171; a core layer 162, on opposite surfaces of which are provided conductive layers 172 and 173; a pre-impregnated layer 163; a core layer 164, on opposite surfaces of which are formed the conductive layers 174 and 175; a pre-impregnated layer 165; and a core layer 166, on opposite surfaces of which are provided the conductive layers 176 and 177, are laminated and bonded together. The through holes 30 are so formed that they penetrate the multi-layer plastic substrate 16.

In FIG. 1, the conductive layers 171 and 172 are plane layers for a ground power source GND, and the conductive layers 174 and 176 are plane layers for power supply source $V_{DD}$. The plane layers are large conductive layers formed completely on the reverse surfaces of the insulating layers 161, 162, 164 and 166, which are core layers. It should be noted that the plane layers are not formed in the areas wherein the through holes 30 are formed, except for those which are to be connected. A plurality of signal lines are provided, mainly for the conductive layers 173 and 175. As is shown in the above example, essentially, the plane layers for the power supply source and the ground power source are formed between the conductive layers for which signal lines are provided. As a result, the occurrence of crosstalk between the vertically positioned signal lines is prevented, and a signal wiring structure is provided with impedance matching of 50 Ω.

An opening is formed in the centers (right end as shown in FIG. 1) of the insulating layers 162 and 161. A larger opening is formed in the insulating layers 163 and 164, and an even larger opening is formed in the insulating layers 165 and 166. As a result, an area 33, wherein a bonding pad 32 is formed, is defined around the opening in the core layer 162, and an area 38, wherein a bonding pad 36 is formed, is defined around the opening in the core layer 164, so that a structure having two bonding pads stages are provided. The bonding pads 32 and 36 are connected to the LSI chip 18 by bonding wires 18, and the chip accommodating portion defined by the openings is sealed with resin 20.

The feature of this embodiment is that there are two levels for areas wherein the bonding pads are formed, and side wall conductive layers 34 and 37 are formed on the side walls of the core layers 162 and 164 to connect the power source bonding pads 32, 36 on the obverse surfaces to the power source plane layers 172 and 174 on the reverse surfaces respectively.

Specifically, in addition to the signal lines, the signal bonding pad and the ground power source bonding pad 32 are formed on the obverse surface of the core layer 162, and the ground power source plane layer 172 is formed on the reverse surface. The side wall conductive layer 34 formed on the side wall of the core layer 162 connects the ground power source bonding pad 32 with the ground power source plane layer 172. The ground power source plane layer 172 is connected via the through hole 30 to the external ground terminal 28. Therefore, in the named order, the ground voltage GND is transmitted to the LSI chip 10 via the external terminal 28, the through hole 30, the ground power source plane layer 172, the side wall conductive layer 34, the ground bonding pad 32, and the bonding wire 18.

Similarly, in addition to the signal lines, the signal bonding pad and the ground power source bonding pad 36 are formed on the obverse surface of the core layer 164, and the power supply source plane layer 174 is formed on the reverse surface. The side wall conductive layer 37, which is formed on the side wall of the core layer 164, connects the power source bonding pad 36 to the power supply source plane layer 174. The power supply source plane layer 174 is connected to the power supply source external terminal 26 via the through hole 30. Therefore, in the named order, the power voltage $V_{DD}$ is transmitted to the LSI chip via the external terminal 26, the through hole 30, the power supply source plane layer 174, the side wall conductive layer 37, the power supply source bonding pad 36, and the bonding wire 18.

With this arrangement, both the ground voltage GND and the power voltage $V_{DD}$ are supplied via the through hole 30 to the bonding pads through the plane layers 172 and 174 and the side wall conductive layers 34 and 37. Since the dimensions of the plane layers and of the side wall conductive layers are sufficiently large, their inductances are lower than is that of the normal signal wiring structure.

Figure 2:
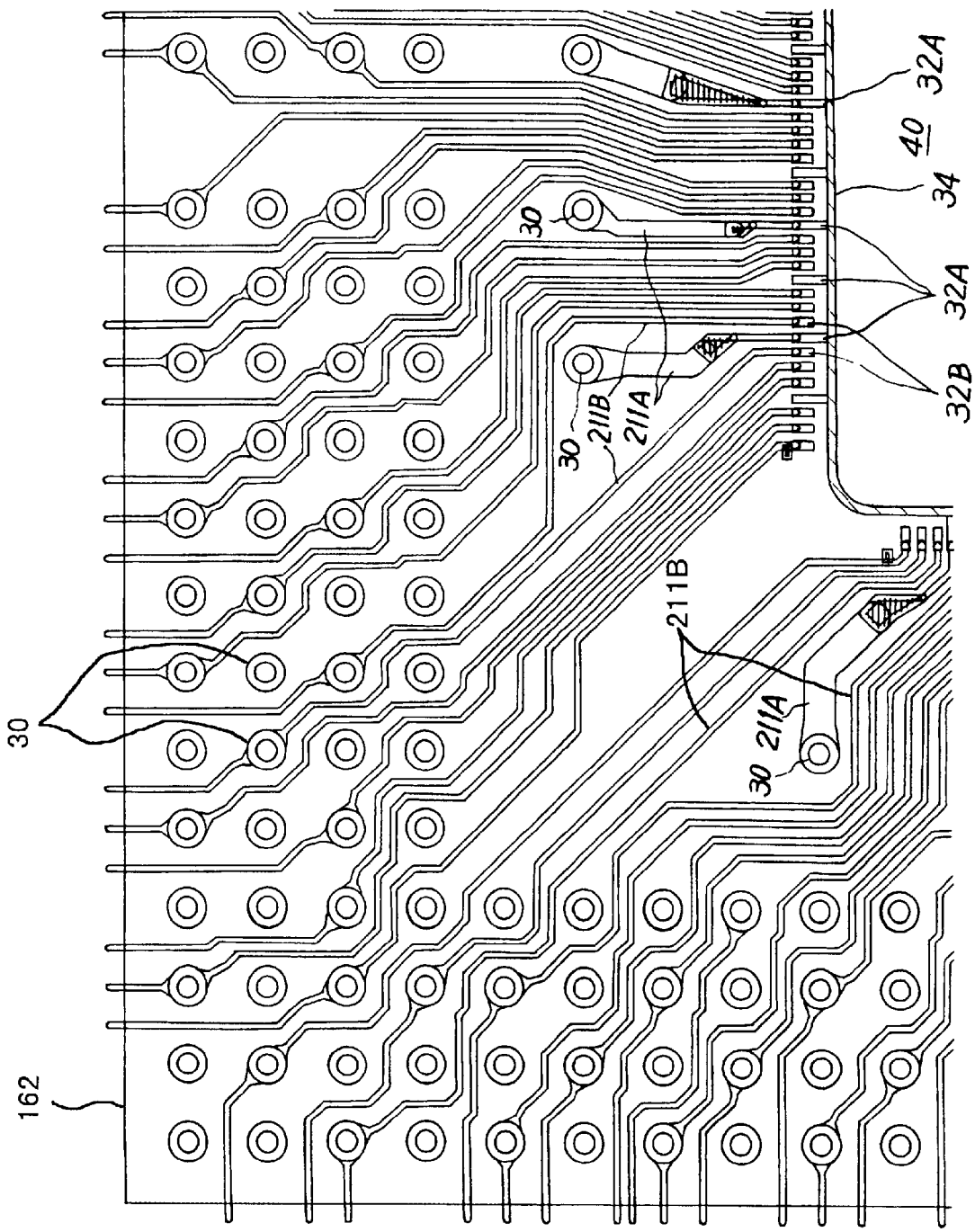
FIG. 2 is a plan view of an example conductive layer on the obverse surface of a core layer which in FIG. 1 is shown as an insulating layer.

FIG. 2 is a plan view of an example conductive layer 173 formed on the obverse surface of the core layer 162, an insulating layer, in FIG. 1. In FIG. 2 are shown a quarter of the area of the core layer 162 and a portion of an opening 40. The side wall conductive layer 34 is formed on the side wall of the opening 40, and a plurality of bonding pads 32 are formed around the opening 40. These bonding pads include a plurality of ground bonding pads 32A and a plurality of signal bonding pads 32B. The ground bonding pads 32A are extended toward the opening 40 and are connected to the side wall conductive layer 34. The signal bonding pads 32B are provided to the other side from the opening 40, and are connected to the through holes 30 which are represented by the circular shapes. The structure of the conductive layer formed on the obverse surface of the core layer 164 is the same as that in FIG. 2, with the exception that the opening is larger.

As is shown in FIG. 1, the side wall conductive layer 37, connected to the power supply source plane layer 174, is electrically insulated from the conductive layer 173 by the pre-impregnated layer 163. The side wall conductive layer 34, which is connected to the ground power source plane layer 172, is electrically insulated from the metal support substrate 12, which constitutes the die stage, by the insulating layer 161. Since the two plane layers 172 and 174 are connected to the bonding pads by means of the side wall conductive layers 34 and 37, the inductance can be reduced.

As is described above, when bonding pad areas are provided at multiple levels, accordingly, a plurality of openings are formed in the insulating layers. Therefore, the side walls of the individual openings, deposited by the plating method, are employed to form the side wall conductive layers, so that direct connections with the bonding pads on the insulating layers can be provided for a plurality of plane layers.

Figure 3:
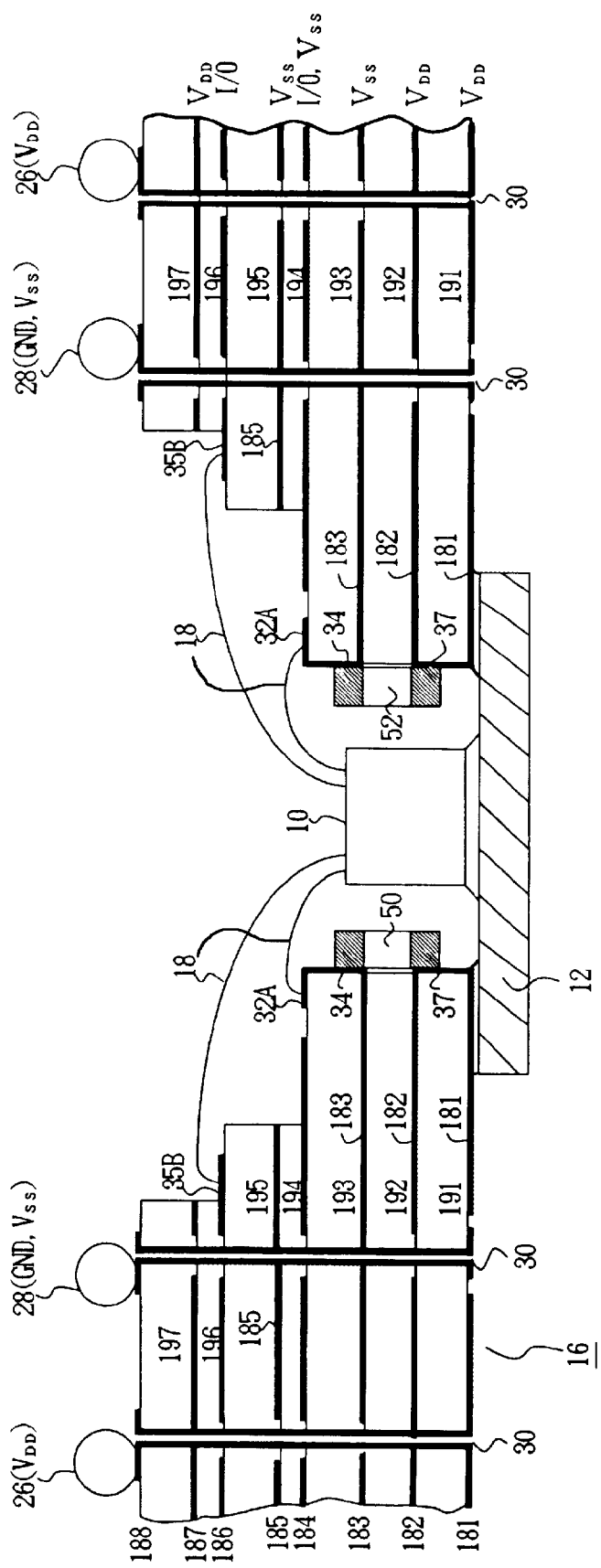
FIG. 3 is a partial cross-sectional view of a multilayer plastic package according to a second embodiment of the present invention.

FIG. 3 is a partial cross-sectional view of a multi-layer plastic package according to a second embodiment of the present invention. In the package in FIG. 3, a support substrate 12 on which an LSI chip 10 is mounted is bonded to a multi-layer substrate 16. For the multi-layer substrate 16 design, laminated are four insulating layers 191, 193, 195 and 197, which are core layers, and three insulating layers 192, 194 and 196, which are impregnated layers, for bonding together the above mentioned core layers. Conductive layers 181 to 188 are formed on the obverse surfaces and the reverse surfaces of the core layers 191, 193, 195 and 197.

In the example shown in FIG. 3, the conductive layers 181 and 182 are plane layers for the power supply source $V_{DD}$, which are connected together by a plated, side wall conductive layer 37 formed on the side wall of the opening in which the LSI chip 10 is contained. The conductive layer 183 is a plane layer for the ground GND($V_{SS}$), and is connected to a ground bonding pad 32A by a side wall conductive layer 34. In addition to the bonding pad 32A, a plurality of signal lines are formed in the conductive layer 184. In other words, the structure of the conductive layer 184 is as is shown in the plan view in FIG. 2. The conductive layer 185 is a plane layer for the ground GND($V_{SS}$), and provided in the conductive layer 186 are a plurality of signal lines. The conductive layer 187 is a plane layer for the power supply source $V_{DD}$, and the topmost conductive layer 188 is a conductive pattern layer for external terminals.

External terminals 26 are power supply source ball terminals which are connected via through holes 30 to power supply source plane layers 181, 182 and 187. External terminals 28 are ground ball terminals which are connected via through holes 30 to the ground plane layers 183 and 185. A signal bonding pad 35B and the ground bonding pad 32A are connected by bonding wire 18 to the LSI chip 10. Although not shown in FIG. 3, as shown in FIG. 1 the LSI chip 10 and the bonding wire 18 are sealed with resin.

The feature of the second embodiment is that when the same opening is formed in the laminated insulating layers 191 and 193, which are core layers, the electrically separated side wall conductive layers 34 and 37 are formed on the side walls of the openings in the core layers 191 and 193, so that a plurality of types of power source plane layers can be connected, with a low inductance, to the conductive layers on the obverse surfaces. That is, the side wall conductive layer 37 for the core layer 191 and the side wall conductive layer 34 for the core layer 193 are electrically insulated from each other by the pre-impregnated layer 192. As is described above, with the arrangement wherein there are a plurality of laminated core layers, a plurality of side wall conductive layers, which are electrically insulated from each other, can be provided by forming these side wall conductive layers for the respective core layers. Therefore, when a plurality of types of power source plane layers are required for a large LSI chip, such a plurality of side wall conductive layers can be effectively employed.

In FIG. 3, as well as in FIG. 1, a side wall conducive layer may be formed on the side wall of the core layer 195, so that another power source bonding pad, which is formed in the area for the bonding pad 35B at the upper level, can be connected to the plane layer 185.

In the second embodiment in FIG. 3, chip capacitors 50 and 52 are inserted between the two side wall conductive layers 34 and 37 to absorb a change in the potential between the power supply source and the ground when large current occurs in the power supply sources. As is shown in FIG. 3, a special area is not required for the support area 12 in order to mount the chip capacitors 50 and 52.

Figure 4:
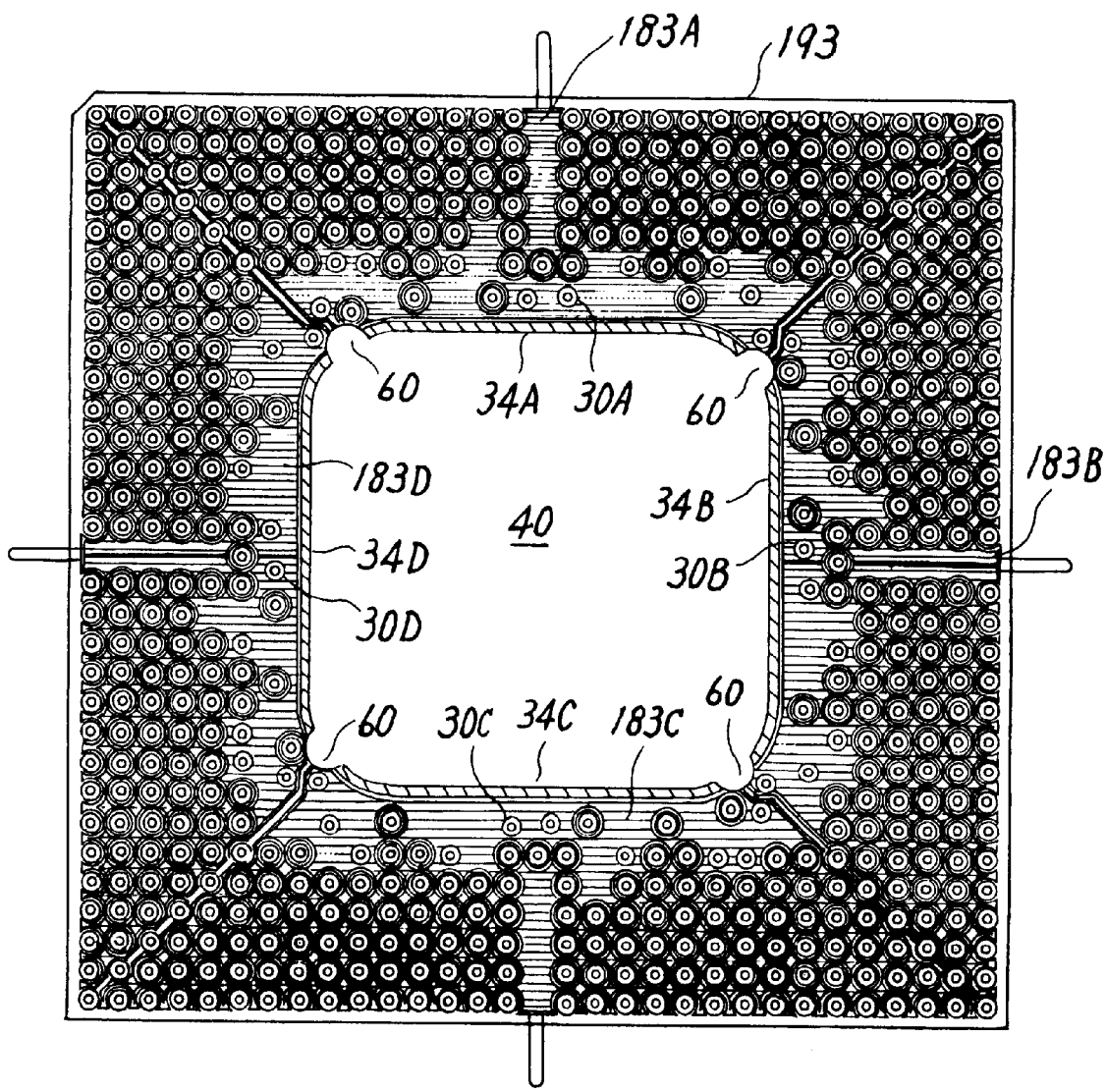
FIG. 4 is a plan view of the reverse surface of a core layer according to a third embodiment of the present invention.

FIG. 4 is a plan view of the reverse surface of a core layer 193 according to a third embodiment of the present invention. The cross-sectional structure for the third embodiment is the same, for example, as that in FIG. 3, with the exception that a conductive layer 183 on the reverse surface of the core layer 193 is divided into a plurality of plane layers 183A to 183D. Furthermore, four divided side wall conductive layers 34A to 34D are formed on the side wall of an opening 40 in the core layer 193. Four power source bonding pads 32A (not shown) and the four plane layers 183A to 183D formed on the reverse surface are connected together by the side wall conductive layers 34A to 34D.

The side wall conductive layers 34A to 34D in the opening 40 are electrically insulated by a recessed portion 60 formed in the four corners of the opening 40. That is, in this embodiment, since a plurality of electrically insulated side wall conductive layers are formed on the side wall of the core layer, a plurality of electrically insulated plane layers formed on the reverse surface can be connected to the bonding pads on the obverse surface through the side wall conducive layers which have low inductances.

As will be described later, according to a method for forming side wall conductive layers on the side wall of a core layer, which is an insulating layer, plated layers are formed by electroless plating on the obverse surface, the reverse surface and the side wall of a core layer, and then the plated layer on the obverse surface and the reverse surface are removed while the opening is masked. Therefore, in order to separate the plated layer formed on the side wall of the opening, an effective method is for the core layer to be die-cut and for the recessed portion 60 to be so formed as that the side wall conductive layer is isolated.

The plane layers 183A to 183D shown in FIG. 4 are electrically separated from each other and are shaped like a trapezoid, while circles in FIG. 4 denote through holes which are not connected to these plane layers 183. Double circles 30A to 30D on the plane layers 183 are connected to the respective plane layers 183A to 183D. These plane layers 183 all serve as ground or power supply source plane layers. However, some plane layers 183 may be employed as ground plane layers and the others may be employed as power supply source plane layers.

As is apparent from the first, the second and the third embodiments, to cope with a request for a plurality of types of power source plane layers (a plurality of power supply sources $V_{DD}$ and a plurality of ground GND), the package of the present invention for accommodating a large LSI chip is provided with a plurality of side wall conductive layers in order to connect the plane layers to bonding pads on the obverse surfaces, or to other plane layers. That is, the side wall conductive layers provided by the present invention are, first, the side wall conductive layers which are formed on the side walls of the individual core layers for a multi-level bonding pad structure; second, the side wall conductive layers which are formed on the side walls of the individual laminated core layers and are separated from each other by the pre-impregnated layers formed between the core layers; and third, the side wall conductive layers which are formed separately on the side wall of a single core layer. When these structures are adequately combined and employed, more types of plane layers can be connected through the side wall conductive layers with low inductance to the conductive layers on the surfaces.

Figure 5:
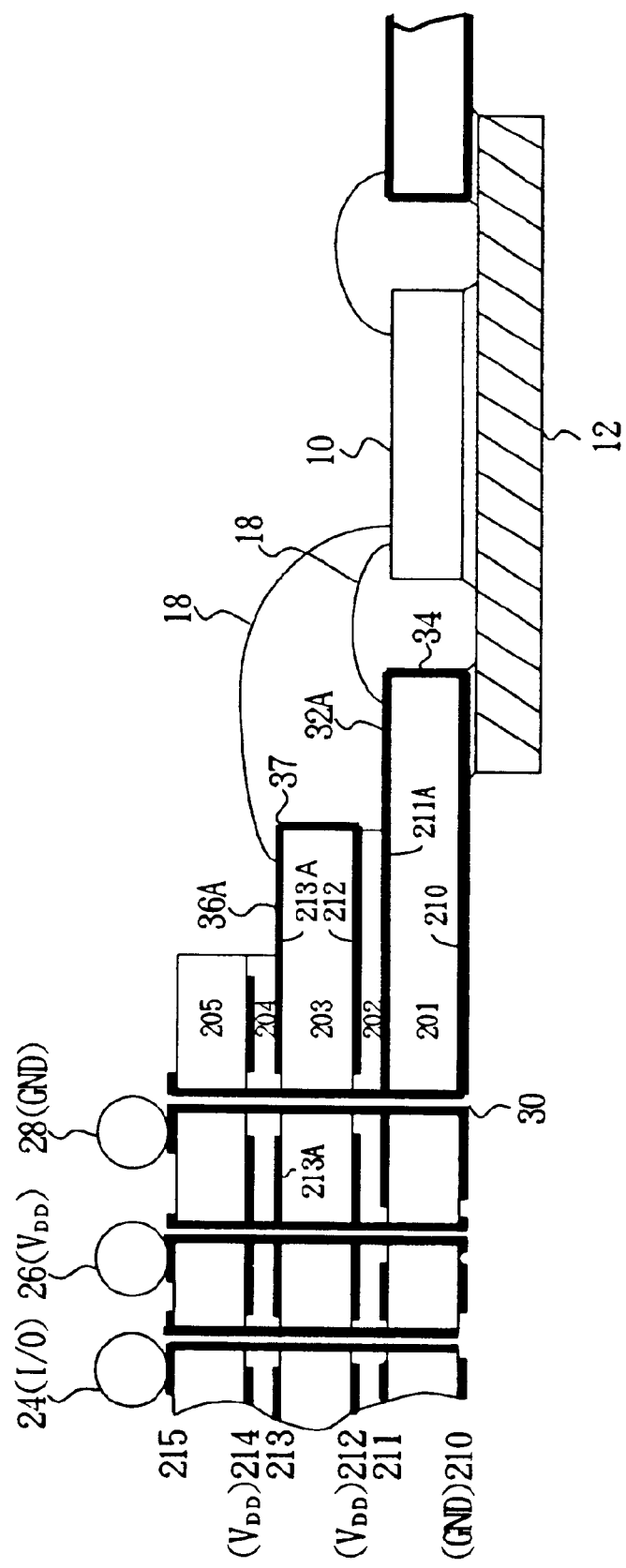
FIG. 5 is a partial cross-sectional view of a package according to a fourth embodiment of the present invention.

FIG. 5 is a partial cross-sectional view of a package according to a fourth embodiment of the present invention. The fourth embodiment will now be described while referring to FIG. 5 and the plane view in FIG. 2. The example in FIG. 5 has a multi-layer structure wherein core layers 201, 203 and 205, which are insulating layers, are bonded by pre-impregnated layers 202 and 204. Conductive layers 210 to 215 are formed for the individual core layers. In the example in FIG. 5, the conductive layer 210 is a plane layer for ground GND, the conducive layer 211 is a plane layer for which signal wiring and ground wiring are provided, the conducive layer 212 is a plane layer for power supply source $V_{DD}$ the conductive layer 213 is a plane layer for which signal wiring and power supply source wiring are provided, the conductive layer 214 is a power supply source plane layer, and the conductive layer 215 is a conductive layer for an external terminal.

The ground plane layer 210 is connected, by means of a side wall conductive layer 34 having a low inductance, to a ground bonding pad 32A on the obverse surface of the core layer 201. The power supply source plane layer 212 is connected, by means of another side wall conductive layer 37 having a low inductance, to a power supply source bonding pad 36A on the surface of the core layer 203. In this example, two side wall conductive layers are employed for a two-level bonding pad structure.

As is shown in FIG. 5, the ground plane layer 210 is connected to an external terminal 28 via a through hole 30. The ground bonding pad 32A is connected via the same through hole 30 along ground wiring 211A on the obverse surface of the core layer 201. The ground wiring 211A is also shown in the plan view in FIG. 2. In FIG. 2 is shown the structure of the conductive layer lying on the surface of the core layer 201. As is shown in FIG. 2, the ground bonding pad 32A is connected to the side wall conductive layer 34, and also is extended to the side opposite to an opening 40 and is connected along the ground wiring 211A to a ground through hole. The ground wiring 211A is provided between signal lines 211B(see FIG. 2), which are formed on the obverse surface in high density, and is employed as a shielding line for these signal lines so as to reduce crosstalk among the signal lines. Since both surfaces of the ground wiring 211A are connected to the external terminal 28 via the through hole 30, the ground wiring 211A is electrically very stable, and the shielding effect provided between the signal lines 211B on both surfaces is large.

The power source bonding pad 36A shown in FIG. 5 is connected to the through hole 30 along a power supply source line 213A. In this case, the power supply source wiring 213A is connected at both ends to the through hole 30, and can provide an effective shielding effect.

Figure 6:
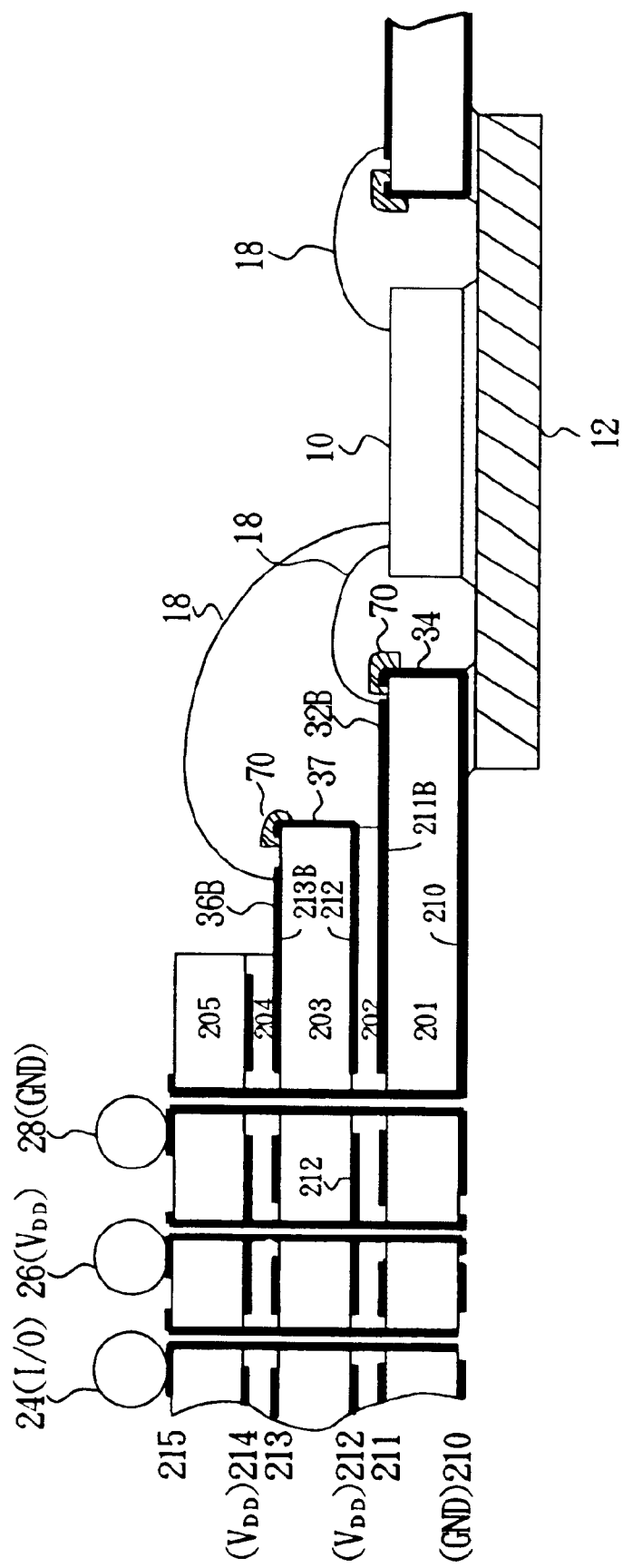
FIG. 6 is a partial cross-sectional view of a package according to a fifth embodiment of the present invention.
Figure 7:
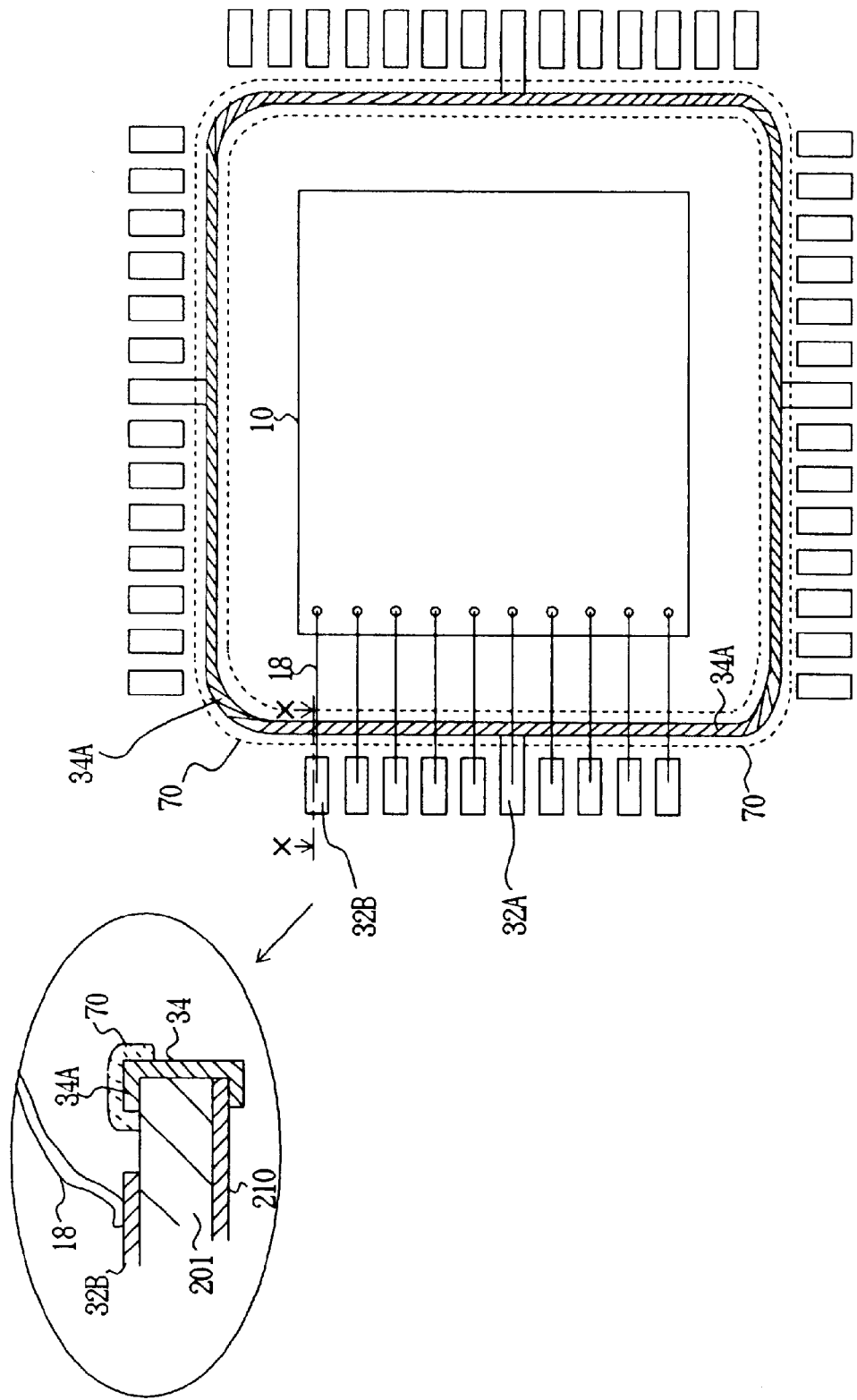
FIG. 7 is a partial plan view of a package according to the fifth embodiment of the present invention.

FIG. 6 is a partial cross-sectional view of a package according to a fifth embodiment of the present invention, and FIG. 7 is a plan view of the package. The fifth embodiment in FIG. 6 has the same structure as has the fourth embodiment in FIG. 5; and laminated core layers 201, 203 and 205 and pre-impregnated layers 202 and 204, which are insulating layers. A conductive layer 210, which serves as a ground plane layer, is formed on the reverse surface of the core layer 201, and a ground bonding pad, a signal bonding pad 32B and a conductive layer 211, which serves as a signal line 211B, are formed on the obverse surface of the core layer 201. A conductive layer 212, which serves as a power supply source plane layer, is formed on the reverse surface of the core layer 203, and a power supply source bonding pad, a signal bonding pad 36B and a conductive layer 213, which serves a signal line 213B, are formed on the obverse surface of the core layer 203. The structure in FIG. 5 is also applied for the core layer 205.

Side wall conductive layers 34 and 37 are formed on the side walls of openings formed in the core layers 201 and 203. The side wall conductive layers 34 and 37 are extended along the breadth of the side walls respectively. Further, depending on the side wall conductive layer forming process, the side wall conductive layers may be formed so that they extended up to the edges of the openings in the core layers. In the fifth embodiment, an insulating resin film 70 is formed to cover the side wall conductive layers which are extended up to the edges of the openings. Thus, the occurrence of a short circuit involving bonding wires 18 and the side wall conductive layers 34, 37 can be prevented.

Figure 8:
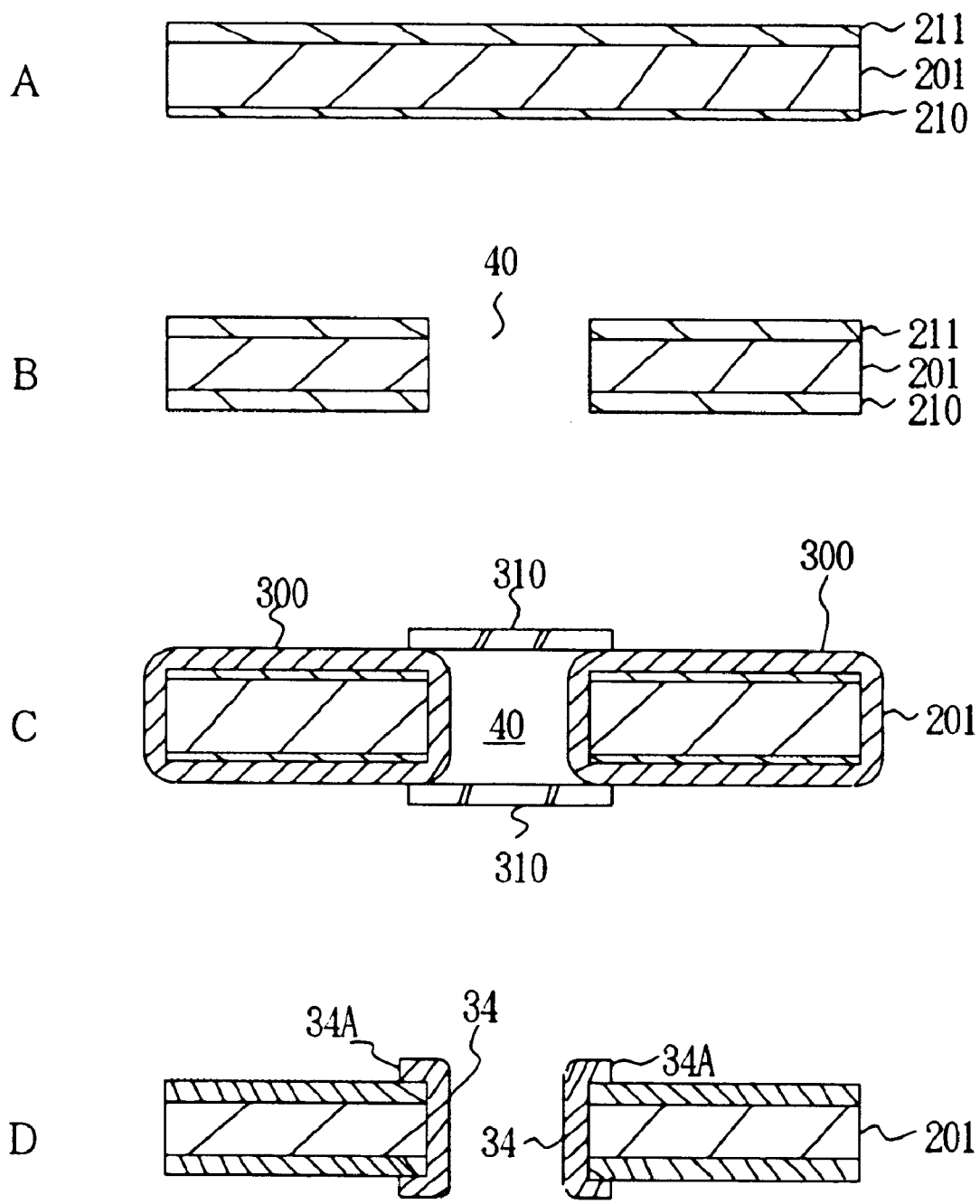
FIGS. 8A to 8D are diagrams showing the processing for forming side wall conductive layers for a core layer.

FIGS. 8A to 8D are diagrams for showing the processing for forming a side wall conductive layer on a core layer. Through this processing, as an example, the core layer 201 in FIG. 6 can be formed. As is shown in FIG. 8A, a predetermined pattern for a conductive layer 211 is formed by the plating method on the obverse surface of a core material 201 made of polyimide resin, while a predetermined pattern for a conductive layer 210 is formed, also by the plating method, on the reverse surface. This process is the same as a normal method used for forming a core material for a printed board. Then, as is shown in FIG. 8B, an opening 40 is formed in the center of the core material 201 by mechanical die cutting in order to accommodate an LSI chip.

Following this, as is shown in FIG. 8C, by using electroless plating a conductive layer 300 made of, for example, ??? is formed across the entire obverse surface, the reverse surface and the side wall of the core material 201. Lids 310 for closing the opening 40 are attached to the obverse surface and the reverse e surface of the conductive layer 300. Then, the plated layer 300 is etched, while the lids 310 are used as masks. As a result, as is shown in FIG. 8D, the side wall conductive layer 34 is so formed that it has areas 34A which extend from the edges of the opening 40 toward the obverse surface and to the reverse surface.

In the plan view in FIG. 7 are shown the areas 34A which extend around the edges of the opening 40. Since the side wall conductive layer 34 is formed across the entire surface of the side wall, the extended areas 34A are formed around the edges of the opening. Therefore, any occurrence of a short circuit is likely to take place between the bonding wire 18, which connects the LSI chip 10 to the signal bonding pad 32B, and the extended area 34A. To prevent a short circuit, a cover layer 70, composed of an insulating resin, is formed in an area indicated by broken lines in the plan view in FIG. 7, and covers the area 34A at the edge of the opening 40. In a cross-sectional view taken along X—X, which is magnified and displayed in an oval inset in FIG. 7, is shown the structure wherein the cover layer 70 overlaps the extended area 34A of the side wall conductive layer 34.

Figure 9:
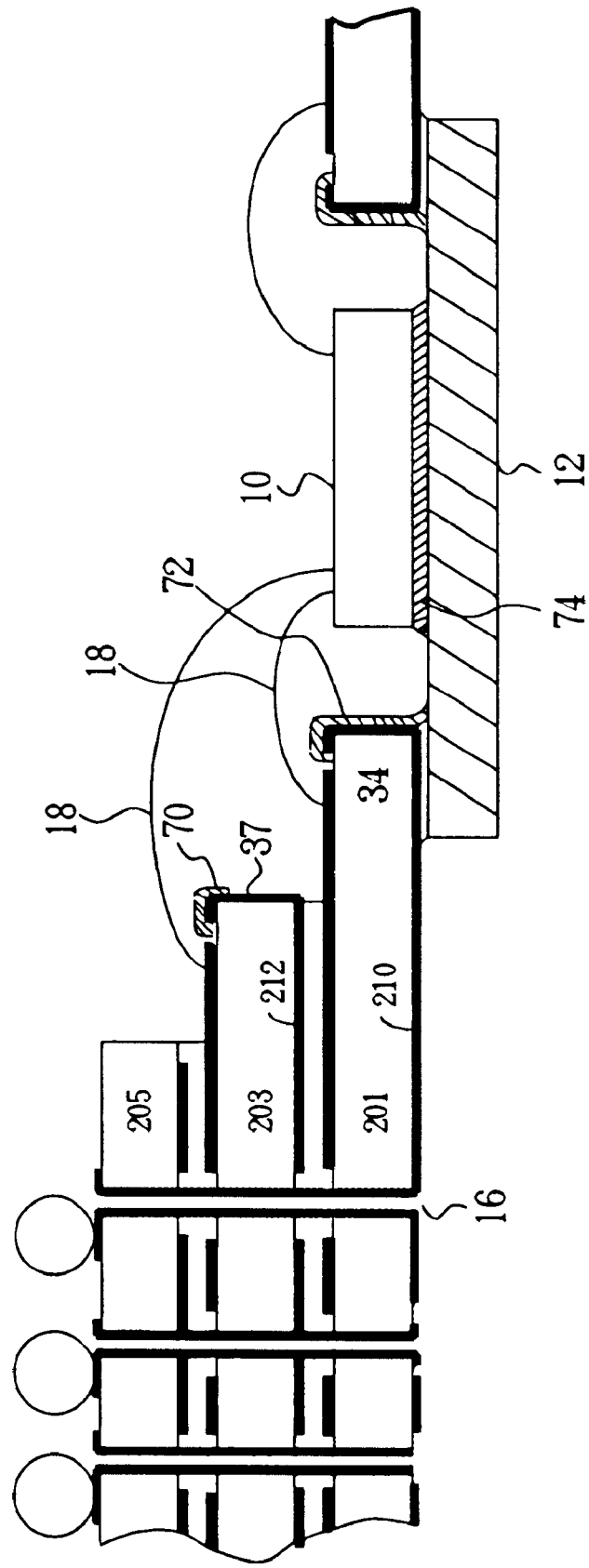
FIG. 9 is a partial cross-sectional view of a package according to a sixth embodiment of the present invention.

FIG. 9 is a partial cross-sectional view of a package according to a sixth embodiment of the present invention. In this embodiment, a cover layer 72 is formed which entirely covers a side wall conductive layer 34 on a core layer 201, which is laminated on a support substrate 12 on which an LSI chip 10 is mounted. The LSI chip 10 may be die-attached to the conductive support substrate 12 which is plated by conductive material 74. In this case, the conductive material 74 can spread out over the surface of the support substrate 12, and can cause a short circuit with the side wall conductive layer 34. As a result, the die attachment material 74 could extend across the side wall conductive layer 34, and could cause a short-circuit with the bonding wire 18.

To prevent such a short circuit, in the embodiment shown in FIG. 9, the cover layer 72 is so extended from the obverse surface side of the core layer 201 to the support substrate 12 so as to cover the side wall conductive layer 34. Further, as in the fifth embodiment, a cover layer 70 is formed at the opening edge of a core layer 203 to prevent a short circuit with the bonding wire 18.

According to the present invention, a multi-layer plastic package having the optimal structure required by an LSI chip can be provided by properly combining the above described embodiments. Although in the drawings individual embodiments are specifically shown, from the above description, how to adequately combine and employ the above described embodiments will be obvious to one having ordinary skill in the art.

As is described above, according to the present invention, a plurality of electrically independent side wall conductive layers can be formed for plane layers which are connected to a plurality of power supply sources and ground power sources. Therefore, a plastic package can be provided which has the optimal structure for the accommodation of an LSI chip.

Furthermore, according to the present invention, since the insulating cover layer is formed on the side wall conductive layer, a short circuit between the side wall conductive layer and the bonding wire, or the die attachment material, can be prevented.

What is claimed is:

1. A plastic package for accommodating a semiconductor chip comprising:

(a) a first insulating layer, in which a first opening is formed to accommodate said semiconductor chip, having a plurality of first bonding pads, including a first power source bonding pads, formed on the obverse surface adjacent to the top of said first opening, a first power source plane layer formed on the reverse surface, a first side wall conductive layer, formed on the side wall of said first opening, for connecting said first power source bonding pad on said obverse surface to said first power source plane layer on said reverse surface, a plurality of first signal lines formed on the obverse surface and connected to the first bonding pads, and a first power source line formed on the obverse surface and connected to the first power source bonding pad, said first power source line being located between the plurality of first signal lines;

(b) a second insulating layer, which covers said first insulating layer and in which a second opening is formed which is larger than said first opening, having a plurality of second bonding pads, including a second power source bonding pad which is formed on the obverse surface adjacent to the top of said second opening, a second power source plane layer formed on the reverse surface, a second side wall conductive layer, formed on the side wall of said second opening, for connecting said second power source bonding pad on said obverse surface to said second power source plane layer on said reverse surface, a plurality of second signal lines formed on the obverse surface and connected to the second bonding pads, and a second power source line formed on the obverse surface and connected to the second power source bonding pad, said second power source line being located between the plurality of second signal lines;

(c) a support substrate provided at said first opening for mounting said semiconductor chip thereon;

(d) a first external power source terminal for connection to said first power source plane layer and said first power source line via a first through hole; and (e) a second external power source terminal for connection to said power source plane layer and said second line via a second through hole.

2. A plastic package accommodating a semiconductor chip comprising:

an insulating layer, in which is formed an opening for accommodating said semiconductor chip, having a plurality of bonding pads, which includes including a power source bonding pad formed on the obverse surface adjacent to the top of said opening, having a power source plane layer formed on the reverse surface, and having a side wall conductive layer formed on the side wall of said opening for collecting said power source bonding pad on said obverse surface to said power source plane layer on said reverse surface;

a support substrate provided at said opening for mounting said semiconductor chip thereon; and a power source external terminal for being connected to said power source plane layer via a through hole, wherein on the obverse surface of said insulating layer are provided signal lines which are to be connected to said bonding pads, and power supply lines, which are located between the signal lines, for connecting said power source bonding pads to said through hole.

* * * * *